United States Patent [19]

Steil et al.

[11] Patent Number: 4,596,930
[45] Date of Patent: Jun. 24, 1986

[54] ARRANGEMENT FOR MULTISPECTAL IMAGING OF OBJECTS, PREFERABLY TARGETS

[75] Inventors: Hans-Jürgen Steil, Appen; Wolfgang Fibich, Pinneberg, both of Fed. Rep. of Germany

[73] Assignee: Licentia Patent-Verwaltungs-GmbH, Frankfurt, Fed. Rep. of Germany

[21] Appl. No.: 487,025

[22] Filed: Apr. 21, 1983

[51] Int. Cl.⁴ .............................................. H01L 25/00
[52] U.S. Cl. .................................... 250/332; 250/334
[58] Field of Search .................... 250/332, 334, 370 R, 250/370 G, 370 K

[56] References Cited

U.S. PATENT DOCUMENTS

| | | | |
|---|---|---|---|
| 3,806,729 | 4/1974 | Craywood | 250/370 G |
| 3,873,836 | 3/1975 | Greene | 250/370 G |
| 3,902,066 | 8/1975 | Roosild et al. | 250/332 |
| 4,054,797 | 10/1977 | Milton et al. | 250/334 |
| 4,142,925 | 3/1979 | King et al. | 250/332 |
| 4,360,732 | 11/1982 | Chapman et al. | 250/332 |
| 4,423,325 | 12/1983 | Foss | 250/370 G |

OTHER PUBLICATIONS

Gilbert F. Amelio, "Charge-coupled Devices", Scientific American, vol. 230, No. 2, Feb. 1974, pp. 9–11.
Steven Eliot Lange et al, "Pyroelectric/CCD Hybrid Focal Plane", SPIE, vol. 217, Advances in Focal Plane Technology (1980) pp. 225–233.
William S. Chan, "Focal Plane Architecture: An Overview", SPIE, vol. 217, Advances in Focal Plane Technology (1980) pp. 2–8.

Primary Examiner—Bruce C. Anderson
Assistant Examiner—Richard Hanig
Attorney, Agent, or Firm—Spencer & Frank

[57] ABSTRACT

An arrangement for the multispectral imaging of objects, preferably targets, including an optical system for imaging the object dots of the objects on at least one charge-coupled semiconductor element, with each charge-coupled semiconductor element including a plurality of light sensitive individual detectors and a charge-transfer circuit arrangement connected to said detectors. The plurality of individual detectors includes at least two groups of detectors with each group being sensitive to light energy of a different wavelength or wavelength range. The groups of detectors are disposed on the surface of the semiconductor element such that the optical system, due to its scatter circle, images each object dot on at least one detector of each group, and the output signals of each individual detector are fed to the charge-transfer circuit arrangement of the semiconductor element.

10 Claims, 4 Drawing Figures

4,596,930

ARRANGEMENT FOR MULTISPECTAL IMAGING OF OBJECTS, PREFERABLY TARGETS

BACKGROUND OF THE INVENTION

The present invention relates to an arrangement for multispectral imaging of objects, preferably targets. More specifically, the present invention relates to such an arrangement, particularly an infra-red (IR) sensitive or visible light sensitive search, detection or identification instrument or system employing an optical system which images the object dots of the objects on at least one charge coupled semiconductor element which includes a plurality of light sensitive indidivual detectors and a charge-transfer circuit arrangement.

Charge-coupled semiconductor detector devices for optical signals are generally known. They permit a transfer of charges in a controlled manner from one electrode to the adjacent electrode of a semiconductor substrate. They are able to perform an astonishingly broad range of electronic functions and are used, for example, as image sensors in television cameras or in videotelegraph systems.

Charge-coupled image sensors are divided into single-dimension sensors and area or surface sensors. Single-dimension sensors constitute a single straight line array of photosensors with combined read output and sensor circuit, the so-called charge transfer circuit arrangement. Area sensors have a two-dimensional mosaic of photosensors with a combined read output and sensor circuit. A charge transfer circuit includes two types of registers, namely, on the one hand, one serial register at its input and one at its output, each operated serially with two phases of a clock pulse and, on the other hand, parallel registers arranged between these serial registers to be operated in the multiplex mode.

Arrangements for imaging two-dimensional images with the aid of a linear charge-coupled image sensor are generally known in one known arrangement (Scientific American, February 1974, page 10) the image to be scanned is disposed on a rotating drum whose rate of rotation is synchronized, for example, with the vertical scanning phase of a display monitor. Thus, for example, the charge-coupled member and the series connected read-out circuit generate horizontal video lines at a clock pulse rate which is fast enough to display a complete section of a picture of the scene on the monitor.

To be able to make a distinction between two or more objects, particularly targets, in front of a structured background, it is known to compile signals from at least two wavelength ranges with the aid of individual detectors. A first portion of these individual detectors absorbs a first wavelength range while a second portion of the individual dectors absorbs another wavelength range. The drawback is that two separate channels are used with corresponding detectors. This arrangement employs a known arrangement with charge transfer. In another solution, the individual detectors which, in a disadvantageous manner, are arranged one above the other and are thus not simultaneously in the focal plane of an optical system, furnish electrical signals corresponding to the wavelength range absorbed by them to an evaluation circuit arrangement. However, in this arrangement no charge transfer circuit arrangement is possible.

SUMMARY OF THE INVENTION

It is the object of the present invention to provide an arrangement with which a distinction can be made between objects, preferably, targets, by means of signals from at least two wavelength ranges with the aid of individual detectors disposed in one focal plane, with the individual detectors being attached to or inserted into the charge-coupled semiconductor device.

The above object is accomplished according to the present invention by an arrangement for the multispectral imaging of objects, preferably targets, including an optical means for imaging the object dots of the objects on at least one charge-coupled semiconductor element having a plurality of light sensitive individual detectors and a charge-transfer circuit arrangement connected to the detectors, wherein: the plurality of individual detectors includes at least two groups of detectors with each group being sensitive to electromagnetic waves, preferably light or IR energy, of a different wavelength or wavelength range; the group of detectors are disposed on the surface of the semiconductor element such that the optical means, due to its scatter circle, simultaneously images each object dot on equal increments of at least one detector of each group; and the output signals of each of the individual detectors of the groups are fed to the charge-transfer circuit arrangement of the semiconductor element.

Preferably, the individual detectors all have the same surface area and detectors of each group are arranged in strips with the strips of each group being juxtaposed a strip of another group. Alternatively the individual detectors of each group may have different surface areas so as to produce equal output signals.

According to another feature of the invention the detectors may be attached to the surface of the semiconductor element (hybrid technique) or directly formed in the surface of the semiconductor element (monolithic technique).

One advantage of the invention is its use of relatively inexpensive charge coupled semiconductor elements which, due to the use of typical integrated circuit (IC) techniques, can be mass produced quickly and inexpensively. It is a further advantage that the arrangement of all individual detectors in a single focal plane does not require division of the light beam which illuminates the individual detectors. Thus, no optical beam dividing devices, such as, for example, semipermeable mirrors, are required. Moreover, it is known that infrared (IR) charge-coupled detectors (CCD) do not require preamplifiers which are usually necessary for IR detectors and are very electromagnetic impulse-sensitive. This is particularly advantageous if large numbers of detectors are required since then there will be a considerable savings in volume and weight.

DETAILED DESCRIPTION OF THE PREFERRED EMBODIMENTS

Figure 1:
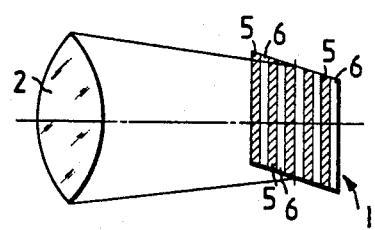
FIG. 1 is a schematic view showing a charge-coupled semiconductor element according to the invention with the associated optical system.
Figure 2:
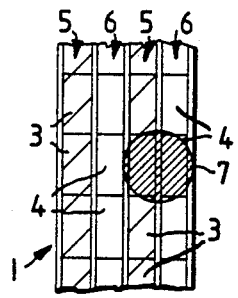
FIG. 2 is an enlarged sectional top view of a charge coupled semiconductor element according to the invention.

Referring now to FIG. 1, there is shown an arrangement for the multispectral imaging of objects (targets) including a semiconductor element 1 with associated optical system 2. In a convertional manner, the semiconductor element 1 includes a charge-transfer circuit arrangement adjacent one major surface. On the side or major surface opposite the charge-transfer circuit arrangement, the semiconductor element 1 is provided with a series of parallel adjacent detector strips 5 and 6 which are radiation sensitive to different wavelengths or wavelength ranges, respectively. The dimensions of the detector strips 5 and 6 are selected such that, due to the scatter circle of the optical system 2, the imaging of an object dot takes place in identical increments on at least one individual detector of each detector strip 5 and 6. This can be seen in FIG. 2, in which two juxtaposed detector strips 5 and 6 include a plurality of individual detectors 3 and 4, respectively. Detector strips 5, i.e., the individual detectors 3, are radiation sensitive, for example, for a wavelength range $\lambda_1 - \lambda_2$, while detector strips 6, i.e., the individual detectors 4, are radiation sensitive to a wavelength range of $\lambda_3 - \lambda_4$. One dot 7 of an object is imaged by the optical system 2 in equal parts on selected adjacent detector strips 5 and 6 including individual detectors 3 and 4. If dot 7 contains IR or visible light of the two wavelength ranges $\lambda_1 - \lambda_2$ and $\lambda_3 31 \lambda_4$, detector strips 5 and 6, and in particular the illuminated detectors 3 and 4, each produce output signals which are fed to the charge-transfer circuit arrangement of the charge-coupled semiconductor element 1. Each detector strip 5 or 6 made up of individual detectors 3 or 4, respectively, thus forms a row or series of detectors for a certain spectral range so that a distinction between objects (targets) by signals from two wavelength ranges is made possible, for example by displays on a monitor. Further wavelength ranges can be covered by increasing the number of detector strips, each formed of a plurality of corresponding individual detectors, which are each sensitive for a respectively different wavelength range, e.g., three different types of detector strips instead of two as shown.

Figure 3:
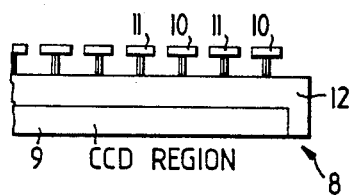
FIGS. 3 and 4 each show a section of a side view of a charge-coupled semiconductor element in hybrid or monolithic technique, respectively.

FIG. 3 shows a charge-coupled semiconductor element 8 which according to the invention has been produced by the hybrid technique. This semiconductor element 8 includes detector strips 10 and 11 which are radiation sensitive for different wavelengths or wavelength ranges respectively and are disposed on and attached to one major surface of a silicon semiconductor element 12 which includes the charge transfer circuit arrangement (CCD-region) 9 adjacent its opposite major surface.

A pyroelectric detector/Si CCD hybrid focal plane is described in SPIE, Vol. 217 Advances in Focal Plane Technology (1980), page 225, for example FIG. 1.

For an IR-double band hybrid focal plane arrangement, one strip made of photovoltaic Cd Hg Te detectors for the 8 to 12$\mu$ region and the other strip made of photovoltaic In Sb detectors for the 3 to 5$\mu$ region are on top of the Si-CCD and cooled down to 77K for optimum performance in both wavelength bands.

Figure 4:
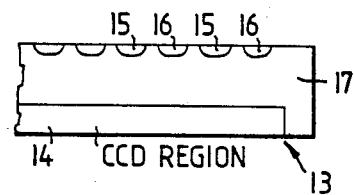

A charge coupled semiconductor element 13 produced by the monolithic technique is shown in FIG. 4. In this arrangement, the detector strips 15 and 16 are integrated into one major surface of a silicon semiconductor to one major surface of element 17 which includes the charge transfer circuit arrangement (CCD-region) 14 adjacent its oposite major surface. The sensitivity to different wavelength ranges of detector strips 15 and 16, respectively, is produced by different doping of the individual detector regions forming the strips 15 and 16.

Monolithic technology of focal plane arrays is described in SPIE Vol 217, Advances in Focal Plane Technology (1980), pages 2 to 8, FIG. 3.

For an IR-double band monolithic focal plane, the silicon can be doped for the IR-sensitive surfaces for example for the 3 to 5$\mu$ region with Indium and for the 8 to 12$\mu$ region with Gallium with a concentration of around $1 \times 10^{17}$ $cm^{-3}$. The device is cooled down to around 28K to achieve best performance in both wavelength regions.

It will be understood that the above description of the present invention is susceptible to various modifications, changes and adaptations, and the same are intended to be comprehended within the meaning and range of equivalents of the appended claims.

What is claimed is:

1. In an arrangement for the multispectral imaging of objects, preferably targets, including an optical means for imaging the object dots of the objects on at least one charge-coupled semiconductor element, with each said charge-coupled semiconductor element including a plurality of light sensitive individual detectors and a charge-transfer circuit arrangement connected to said detectors; the improvement wherein:

said plurality of individual detectors includes at least two groups of detectors with each group being sensitive to electromagnetic waves, preferably light or IR energy, of a different wavelength or wavelength range;

said groups of detectors are disposed on the surface of said semiconductor element such that said optical means, due to its scatter circle, simultaneously images each object dot on equal increments of at least one detector of each of said groups;

said individual detectors of said groups have different surface areas to provide equal output signals; and the output signals of each individual detector of said groups are fed to said charge-transfer circuit arrangement of said semiconductor element.

2. An arrangement as defined in claim 1 wherein: each said group of detectors includes a plurality of detectors arranged in at least one strip; and each said strip of one of said groups is disposed adjacent and parallel to a strip of another of said groups.

3. An arrangement as defined in claim 2 wherein each of said groups includes a plurality of said strips of detectors.

4. An arrangement as defined in claim 3 wherein each of said light sensitive detector strips is formed by two or more separate individual detectors responsive to the associated said wavelength or wavelength range which are mounted on said surface of said semiconductor element including said charge-transfer circuit arrangement and are electrically connected to said semiconductor element.

5. An arrangement as defined in claim 3 wherein said semiconductor element is formed of silicon.

6. An arrangement as defined in claim 3 wherein each of said detector strips is formed by a two or more separate semiconductor regions provided in said surface of said semiconductor element including said charge-transfer circuit arrangement; and wherein the radiation sensitivity for different wavelengths or wavelength ranges for said regions is produced by doping said regions with different basic materials.

7. An arrangement as defined in claim 6 wherein said semiconductor element is formed of silicon.

8. An arrangement as defined in claim 3 wherein said optical means images each object dot on adjacent said individual detectors of adjacent said strips.

9. In an arrangement for the multispectral imaging of object including at least one charge coupled semiconductor element having a plurality of light sensitive detector means for detecting incident light disposed on the surface of said semiconductor element and a charge transfer circuit arrangement connected to said detector means, and optical means for imaging the respective object dots of an object on respective said detector means; the improvement wherein:

each of said detector means includes a plurality of individual adjacently disposed light sensitive detectors, each response to light energy of a different wavelength;

said plurality of detectors means are of a size and disposed adjacent one another such that said optical means, due to its scatter circle, simultaneously images each respective object dot on substantially equal increments of each of said detectors of a respective said detector means;

said detectors of each said detector means have different surface areas so as to provide equal output signals; and the output signal of each of said detectors is fed to said charge-transfer circuit arrangement of said semiconductor element.

10. An arrangement as defined in claim 9 wherein:

said detector means are arranged in an array of parallel strips on said surface of said semiconductor element, with each strip including a plurality of individual detectors sensitive to the same wavelength; each said strip is disposed adjacent a strip including a plurality of individual detectors sensitive to a different wavelength; and individual detectors of adjacent strips are aligned with one another to form the respective said detector means.

* * * * *